United States Patent
Gaska et al.

(10) Patent No.: US 7,429,534 B2
(45) Date of Patent: Sep. 30, 2008

(54) ETCHING A NITRIDE-BASED HETEROSTRUCTURE

(75) Inventors: Remigijus Gaska, Columbia, SC (US); Xuhong Hu, Lexington, SC (US); Qhalid Fareed, Columbia, SC (US); Michael Shur, Latham, NY (US)

(73) Assignee: Sensor Electronic Technology, Inc., Columbia, SC (US)

( * ) Notice: Subject to any disclaimer, the term of this patent is extended or adjusted under 35 U.S.C. 154(b) by 157 days.

(21) Appl. No.: 11/358,303

(22) Filed: Feb. 21, 2006

(65) Prior Publication Data

US 2006/0186422 A1  Aug. 24, 2006

Related U.S. Application Data

(60) Provisional application No. 60/655,193, filed on Feb. 22, 2005.

(51) Int. Cl.
*H01L 21/461* (2006.01)
(52) U.S. Cl. .............. 438/705; 438/711; 438/714; 438/718; 438/735; 438/737; 438/740; 438/751; 438/924; 438/FOR. 179; 257/E21.086; 257/E21.246; 257/E21.403; 257/E21.407; 977/755
(58) Field of Classification Search .......... 438/705, 438/711, 714, 718, 735, 737, 740, 751, 924, 438/FOR. 179
See application file for complete search history.

(56) References Cited

U.S. PATENT DOCUMENTS 5,693,180 A * 12/1997 Furukawa et al. .......... 438/720
6,465,814 B2 * 10/2002 Kasahara et al. .......... 257/192
6,656,802 B2 * 12/2003 Oszustowicz .............. 438/282
6,690,042 B2    2/2004 Khan et al.
6,741,623 B2 *  5/2004 Ishikawa et al. ......... 372/45.01
6,764,888 B2    7/2004 Khan et al.

OTHER PUBLICATIONS

Smith, S. A. et al., "High rate and selective etching of GaN, AlGaN, and AlN using an Inductively coupled plasma". Appl. Phys. Lett., vol. 71, No. 25, Dec. 22, 1997, pp. 3631-3633.
Egawa, Takashi et al., "Characterizations of Recessed Gate AlGaN/GaN HEMTs on Sapphire". IEEE Transactions on Electron Devices, vol. 48, No. 3, Mar. 2001, pp. 603-608.
Fareed, Q. et al., "High Power AlGaN/InGaN/AlGaN/GaN Recessed Gate Heterostructure Field Effect Transistors". Appl. Phys. Lett., vol. 86, Apr. 4, 2005, pp. 1-11 in copy provided.
Geiger, D. et al., "Recess Dependent Breakdown Behavior of GaAs-HFET's." IEEE Electron Device Letters, vol. 16, No. 1, Jan. 1995, pp. 30-32.
Chen, Ching-Hui et al., $Cl_2$ reactive ion etching for gate recessing of AlGaN/GaN field-effect transistors. J. Vac. Sci. Technol. B 17(6), Nov./Dec. 1999, pp. 2755-2758.

(Continued)

*Primary Examiner*—Thanh V Pham
(74) *Attorney, Agent, or Firm*—Hoffman Warnick LLC (57) ABSTRACT

An improved solution for producing nitride-based heterostructure(s), heterostructure device(s), integrated circuit(s) and/or Micro-Electro-Mechanical System(s) is provided. A nitride-based etch stop layer that includes Indium (In) is included in a heterostructure. An adjacent layer of the heterostructure is selectively etched to expose at least a portion of the etch stop layer. The etch stop layer also can be selectively etched. In one embodiment, the adjacent layer can be etched using reactive ion etching (RIE) and the etch stop layer is selectively etched using a wet chemical etch. In any event, the selectively etched area can be used to generate a contact or the like for a device.

21 Claims, 9 Drawing Sheets

OTHER PUBLICATIONS

Wang, Wen-Kai et al., "Low Damage, $Cl_2$-Based Gate Recess Etching for 0.3μm Gate-Length AlGaN/GaN HEMT Fabrication". IEEE Electron Device Letters, vol. 25, No. 2, Feb. 2004, pp. 52-54.

Lee, Jae-Seung et al., "Photo-Electrochemical Gate Recess Etching for the Fabrication of AlGaN/GaN Heterostructure Field Effect Transistor". Jpn. J. Appl. Phys. vol. 40 (2001) Part 2, No. 3A, pp. L198-L200.

* cited by examiner

ETCHING A NITRIDE-BASED HETEROSTRUCTURE

REFERENCE TO PRIOR APPLICATION

The current application claims the benefit of co-pending U.S. Provisional Application No. 60/655,193, entitled "Selective Etching of Nitride Semiconductor Heterostructures", which was filed on Feb. 22, 2005, and which is hereby incorporated herein by reference.

FIELD OF THE INVENTION

The invention relates generally to nitride-based heterostructures, and more particularly, to producing a nitride-based device, integrated circuit, and/or the like, using an improved etching solution.

BACKGROUND OF THE INVENTION

During the production (e.g., fabrication, generation, manufacture, etc.) of a heterostructure device, selective etching of one or more layers in the heterostructure device is frequently performed. In general, selective etching removes some or all of a layer of a first material while removing little or none of an adjacent layer of a second material. Using selective etching, layers in the heterostructure device can be configured to form a desired pattern, e.g., partially cover another layer, have a varying thickness, and/or the like.

For example, selective etching can be used to form a recessed gate in a Heterostructure Field Effect Transistor (HFET), such as a Gallium Nitride (GaN)-based HFET. Inclusion of the recessed gate in the GaN-based HFET can increase the breakdown voltage, alleviate non-ideal effects, suppress current instabilities, and/or the like. To date, selective etching approaches rely on the difference between the etching rates for GaN and Aluminum Nitride (AlN) layers. In particular, two etching technologies are currently used to generate recessed gates in AlGaN/GaN HFETs, reactive ion etching (RIE) and chemical (wet) etching under deep Ultraviolet (UV).

However, use of either technology has its drawbacks. For example, the RIE approach damages the two-dimensional electron gas and significantly decreases the HFET saturation current, while the chemical etching approach is slow, making it difficult to achieve a desired etching pattern. Further, neither approach provides a solution for the selective etching of AlN layers, which are widely used in nitride-based electronic and optoelectronic devices.

In view of the foregoing, there exists a need in the art to overcome one or more of the deficiencies indicated herein and/or one or more other deficiencies not expressly discussed herein.

BRIEF SUMMARY OF THE INVENTION

The invention provides an improved solution for producing nitride-based heterostructure(s), heterostructure device(s), integrated circuit(s) and/or Micro-Electro-Mechanical System(s). A nitride-based etch stop layer that includes Indium (In) is included in a heterostructure. An adjacent layer of the heterostructure is selectively etched to expose at least a portion of the etch stop layer. The etch stop layer also can be selectively etched. In one embodiment, the adjacent layer can be etched using reactive ion etching (RIE) and the etch stop layer is selectively etched using a wet chemical etch. In any event, the selectively etched area can be used to generate a contact or the like for a device.

A first aspect of the invention provides a method of producing a nitride-based heterostructure, the method comprising: obtaining a partial nitride-based heterostructure; applying a nitride-based etch stop layer including Indium (In) above the partial nitride-based heterostructure; applying a nitride-based cap layer above the etch stop layer; and selectively etching the cap layer to expose at least a portion of the etch stop layer.

A second aspect of the invention provides a method of producing a nitride-based heterostructure, the method comprising: obtaining a nitride-based heterostructure, the nitride-based heterostructure including an etch stop layer that includes Indium (In); and selectively etching an adjacent layer to the etch stop layer to expose at least a portion of the etch stop layer.

A third aspect of the invention provides a method of producing a nitride-based heterostructure device, the method comprising: obtaining a partial nitride-based heterostructure; applying a nitride-based etch stop layer including Indium (In) above the partial nitride-based heterostructure; applying a nitride-based cap layer above the etch stop layer; and selectively etching the cap layer to expose at least a portion of the etch stop layer.

A fourth aspect of the invention provides a method of producing a nitride-based integrated circuit, the method comprising: producing at least one nitride-based heterostructure device, the producing comprising: obtaining a partial nitride-based heterostructure; applying a nitride-based etch stop layer comprising Indium (In) above the partial nitride-based heterostructure; applying a nitride-based cap layer above the etch stop layer; and generating at least one of a recessed contact, a facet, or a photonic crystal for the device, the generating including selectively etching at least one of: the cap layer or the etch stop layer; and incorporating the nitride-based heterostructure device in the integrated circuit.

The illustrative aspects of the present invention are designed to solve one or more of the problems herein described and/or one or more other problems not discussed.

BRIEF DESCRIPTION OF THE DRAWINGS

These and other features of the invention will be more readily understood from the following detailed description of the various aspects of the invention taken in conjunction with the accompanying drawings that depict various embodiments of the invention, in which.

It is noted that the drawings are not to scale. The drawings are intended to depict only typical aspects of the invention, and therefore should not be considered as limiting the scope of the invention. In the drawings, like numbering represents like elements between the drawings.

DETAILED DESCRIPTION OF THE INVENTION

It is understood that for the purposes of the present invention, Al means Aluminum, B means Boron, C means Carbon, Cl means Chlorine, Ga means Gallium, In means Indium, K means Potassium, Li means Lithium, N means Nitrogen, O means Oxygen, Si means Silicon, Sr means Strontium, Ti means Titanium, and Zn means Zinc. Further, it is understood that the phrase "any solution" means any now known or later developed solution.

As indicated above, the invention provides an improved solution for producing nitride-based heterostructure(s), heterostructure device(s), integrated circuit(s) and/or Micro-Electro-Mechanical System(s). A nitride-based etch stop layer that includes Indium (In) is included in a heterostructure. An adjacent layer of the heterostructure is selectively etched to expose at least a portion of the etch stop layer. The etch stop layer also can be selectively etched. In one embodiment, the adjacent layer can be etched using reactive ion etching (RIE) and the etch stop layer is selectively etched using a wet chemical etch. In any event, the selectively etched area can be used to generate a contact or the like for a device.

The resulting nitride-based devices (e.g., transistors), integrated circuit(s), system(s) can have an improved quality with respect to increased lifetime, reliability, decreased noise, improved manufacturability, and/or the like. For example, a heterostructure field effect transistor (HFET) produced using the invention demonstrated record power levels, achieved a several order of magnitude reduction in leakage current, showed better stability, and an improved linearity. Additionally, producing a recessed gate as described herein can improve device performance and stability as both room and elevated temperatures. By thinning a barrier layer in an HFET, the recessed gate can decrease the threshold voltage, decrease parasitic source resistances, decrease the peak electric filed, and/or the like, resulting in an increase in the device transconductance and breakdown voltage, and alleviating any trapping effects.

Figure 1A:
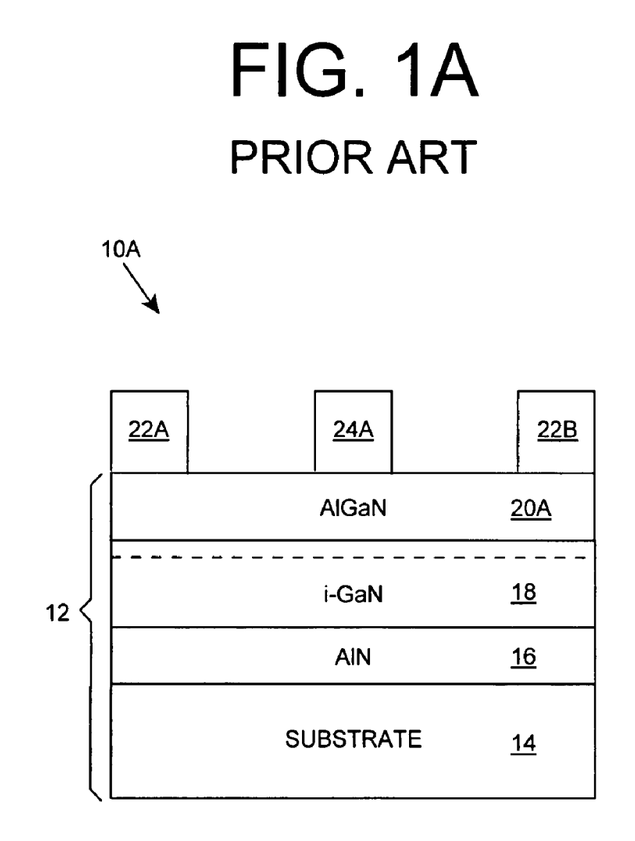
FIGS. 1A-B show typical prior art nitride-based heterostructure devices.
Figure 1B:
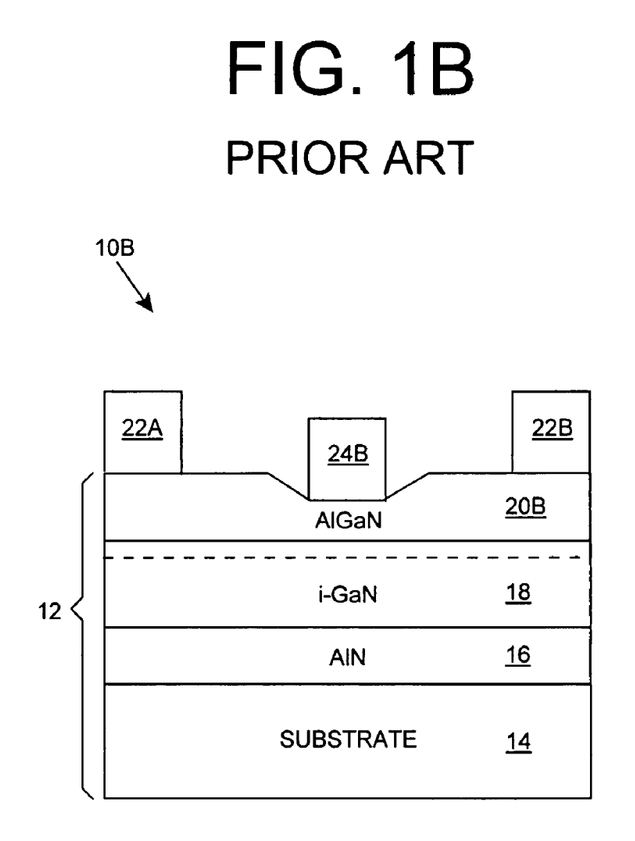

Turning to the drawings, FIGS. 1A-B show typical prior art nitride-based heterostructure devices 10A-B. In particular, each device 10A-B is configured to operate as a HFET 10A-B. Each HFET 10A-B includes a nitride-based heterostructure 12, which includes a substrate 14, an AlN buffer layer 16, an i-type GaN layer 18, and an AlGaN layer 20A-B, respectively. Further, each HFET is shown including source and drain contacts 22A-B, and a gate contact 24A-B, respectively.

Figure 2:
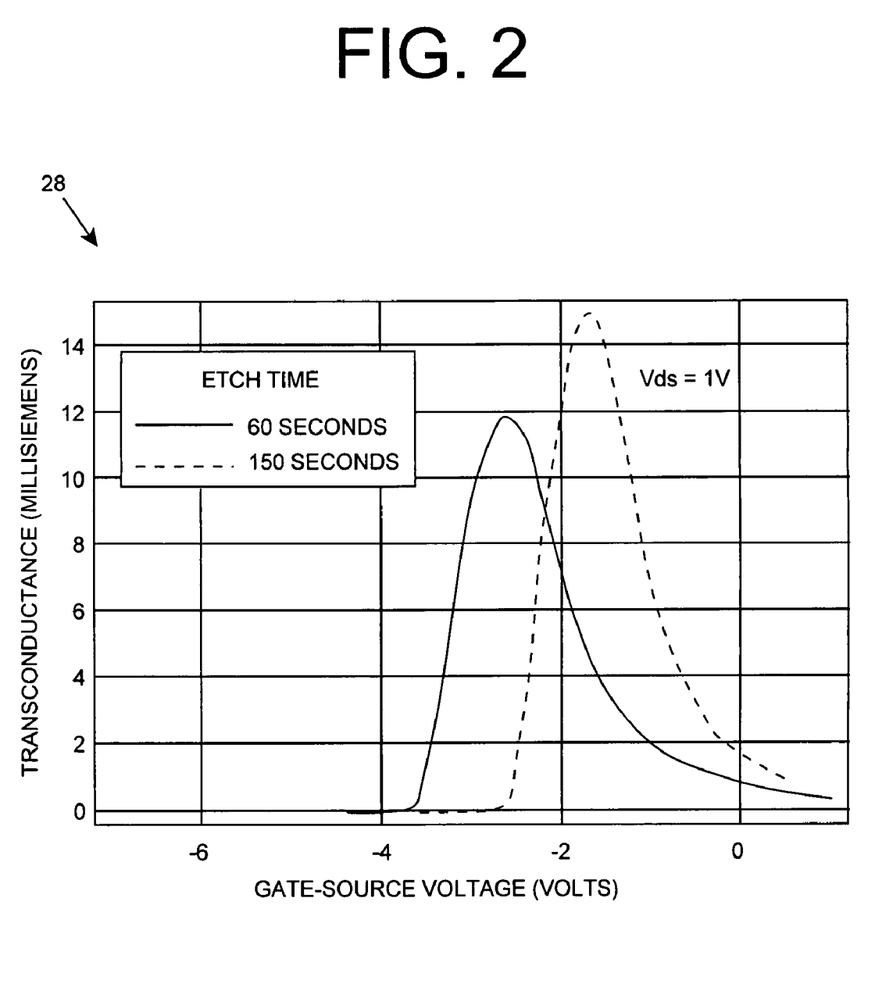
FIG. 2 shows a graph of transconductance as a function of gate-source voltage for the nitride-based heterostructure device of FIG. 1B.

HFET 10A comprises a standard device structure, while HFET 10B comprises a recessed gate 24B. To this extent, recessed gate 24B can be generated by selectively etching AlGaN layer 20B using, for example, reactive ion etching (RIE). FIG. 2 shows a graph 28 of the transconductance as a function of gate-source voltage for HFET 10B (FIG. 1B). As indicated by graph 28, a longer etch time (e.g., 150 seconds versus 60 seconds) yielded a higher transconductance at a higher gate-source voltage (lower voltage differential) for HFET 10B.

Figure 3:
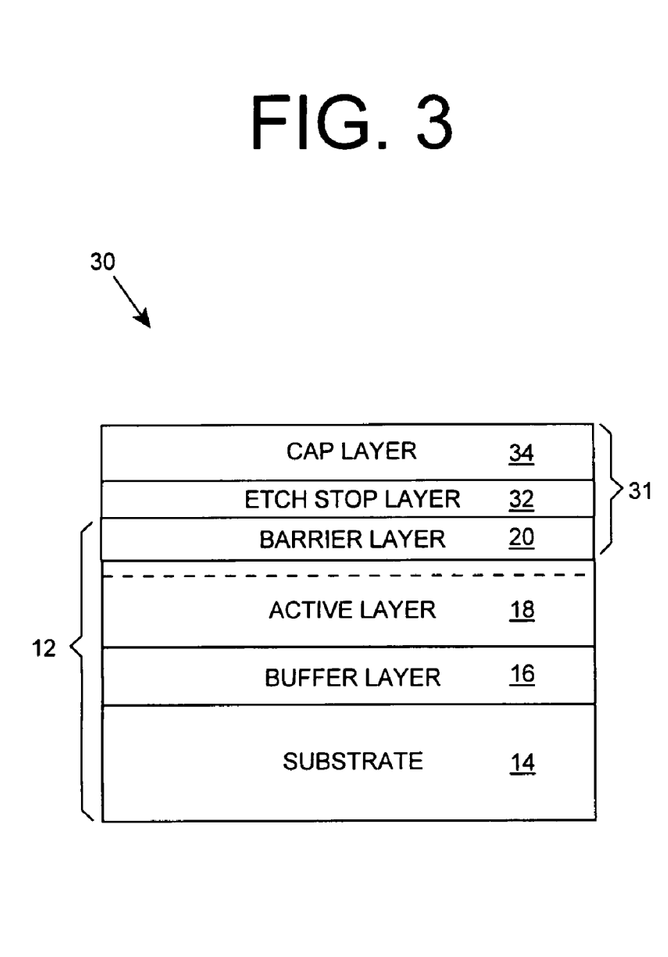
FIG. 3 shows an illustrative nitride-based heterostructure according to an embodiment of the invention.

An embodiment of the invention provides a method for producing an alternative nitride-based heterostructure that can be used to produce (e.g., fabricate, generate, manufacture, etc.) various devices, integrated circuits, and/or the like. FIG. 3 shows an illustrative nitride-based heterostructure 30 according to an embodiment of the invention. Heterostructure 30 includes a partial nitride-based heterostructure 12 (also referred to as "partial heterostructure") that is shown including a substrate 14, a nitride-based buffer layer 16, a nitride-based active layer 18, and a nitride-based barrier layer 20. In one embodiment, partial heterostructure 12 comprises an AlGaN/GaN heterostructure, in which substrate 14 comprises SiC, buffer layer 16 comprises AlN, active layer 18 comprises GaN, and first barrier layer 20 comprises AlGaN.

However, it is understood that various alternatives for partial heterostructure 12 are possible. For example, heterostructure 12 can comprise any type of AlN/GaN/InN based heterostructure. To this extent, substrate 14 could comprise any desired substrate configuration, such as one of: sapphire, AlGaN, GaN, AlN, SiC, Silicon, $LiGaO_2$, $SrTiO_3$, ZnO, and/or the like; buffer layer 16 could comprise any desired buffer layer configuration, such as one of: AlN, GaN, AlGaN, and/or the like; active layer 18 could comprise any desired active layer configuration, such as one of: AlN, GaN, AlGaN, and/or the like; and barrier layer 20 can comprise any desired barrier layer configuration, such as one of: AlN, GaN, AlGaN, and/or the like. In one embodiment, active layer 18 and barrier layer 20 both comprise AlGaN and barrier layer 20 has a molar fraction of Al that is different than a molar fraction of Al for active layer 18. In any event, active layer 18 and barrier layer 20 each can comprise a molar fraction of Al versus Ga that varies anywhere in the range between zero and one hundred percent. Further, one or more layers within heterostructure 12 could include In. For example, instead of active layer 18 comprising AlGaN, it could comprise AlGaInN.

In order to produce nitride-based heterostructure 30, partial nitride-based heterostructure 12 can be obtained using any solution. For example, some or all of partial heterostructure 12 can be purchased from a manufacturer and/or prepared for further processing (e.g., a portion of barrier layer 20 could be removed by, for example, etching). Alternatively, partial heterostructure 12 can be produced using any solution. To this extent, substrate 14 can be obtained, buffer layer 16 can be applied (e.g., deposited) on substrate 14, active layer 18 can be applied (e.g., grown) on buffer layer 16, and barrier layer 20 can be applied (e.g., grown) on active layer 18. It is understood that this process and partial nitride-based heterostructure 12 are only illustrative. To this extent, partial heterostructure 12 could include one or more additional, fewer, and/or different layers, one or more layers that only partially cover another layer, and/or the like.

In any event, barrier layer 20 can comprise a bottom layer of a multi-layer barrier structure 31. To this extent, once partial heterostructure 12 has been obtained, a nitride-based etch stop layer 32 that includes In can be applied above partial heterostructure 12, e.g., on barrier layer 20. Etch stop layer 32 can comprise a thin layer/film, e.g., approximately three nanometers thick, of InGaN, InN, InAlGaN, and/or the like, and can be applied (e.g., grown) using any solution. In one embodiment, etch stop layer 32 comprises InGaN having an In content up to approximately thirty percent, and is applied using migration enhanced metalorganic chemical vapor deposition (MEMOCVD). It is understood that etch stop layer 32 can comprise a molar fraction of In versus Ga that varies anywhere from 0.1% to 100%, with a molar fraction of 100% comprising InN. Subsequently, a nitride-based cap layer 34 (e.g., second barrier layer) can be applied above etch stop layer 32 using any solution. In general, cap layer 34 can include similar content as barrier layer 20, e.g., AlN, GaN, AlGaN, InGaN, and/or the like. In one embodiment, cap layer 34 comprises a textured AlGaN layer.

Figure 4:
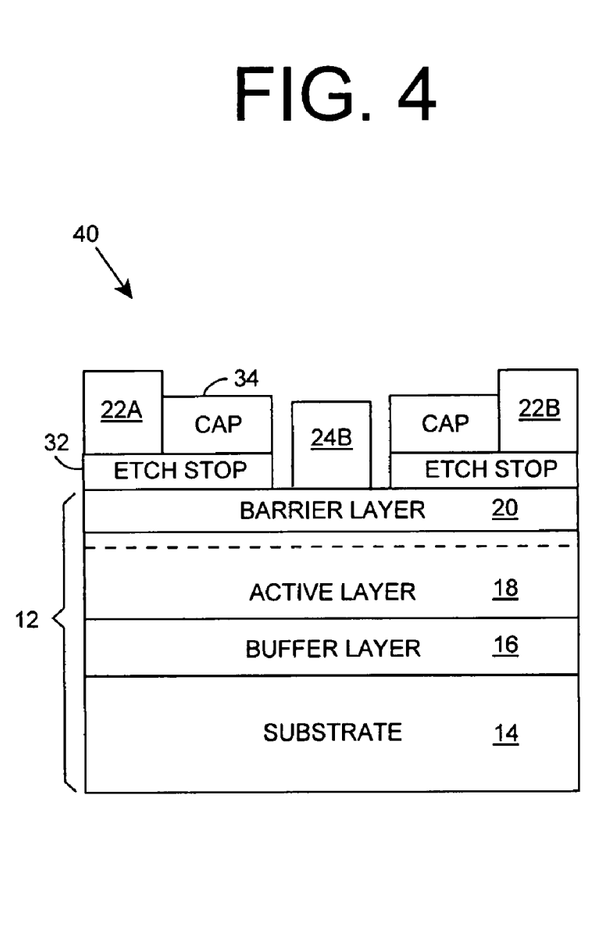
FIG. 4 shows an illustrative nitride-based heterostructure field effect transistor (HFET) that can be produced using the heterostructure of FIG. 3.

Nitride-based heterostructure 30 can be further processed to yield desired characteristics for producing any type of nitride-based device and/or integrated circuit. For example, FIG. 4 shows an illustrative nitride-based HFET 40 that can be produced using heterostructure 30 (FIG. 3). In order to product HFET 40, cap layer 34 and etch stop layer 32 each can be selectively etched. To this extent, cap layer 34 can be selectively etched using, for example, reactive ion etching (RIE) with Boron trichloride ($BCl_3$) as an etching agent, to expose etch stop layer 32 in the area(s) within which contacts 22A-B, 24B are to be located. In this case, etch stop layer 32 is used to stop the RIE etching process. Since the RIE etching rate of InN is at least two orders of magnitude lower than that of AlGaN, GaN or other types of layers, InN, InGaN, and the like can serve as an effective etch stop layer for these types of layers that provides for effective control of the etching rate and/or etching pattern. Subsequently, one or more exposed portions of etch stop layer 32 can be selectively etched to expose barrier layer 20. To this extent, etch stop layer 32 can be selectively etched using, for example, wet chemical etching, to expose barrier layer 20 in an area within which contact 24B is to be located. Further, the wet chemical etching can use diluted potassium hydroxide (KOH) or the like.

The etching of one or more layers can be performed as part of a process for incorporating a device component in the heterostructure device and/or integrated circuit. For example, once a desired area within heterostructure 30 (FIG. 3) is exposed, a device component, such as a contact, can be applied to the area using any solution. To this extent, source and drain contacts 22A-B each can be applied to etch stop layer 32, adjacent to cap layer 34. This configuration reduces a resistance of contacts 22A-B. Similarly, recessed gate contact 24B can be applied to barrier layer 20 as shown. It is understood that the process described herein and configuration of HFET 40 are only illustrative. To this extent, numerous variations are possible. For example, source and/or drain contacts 22A-B could be applied to cap layer 34, gate contact 24B could be applied to etch stop layer 32, and/or the like. It is understood that any combination of additional components can be incorporated onto heterostructure 30 based on the desired operational characteristics of the device being produced.

Figure 5:
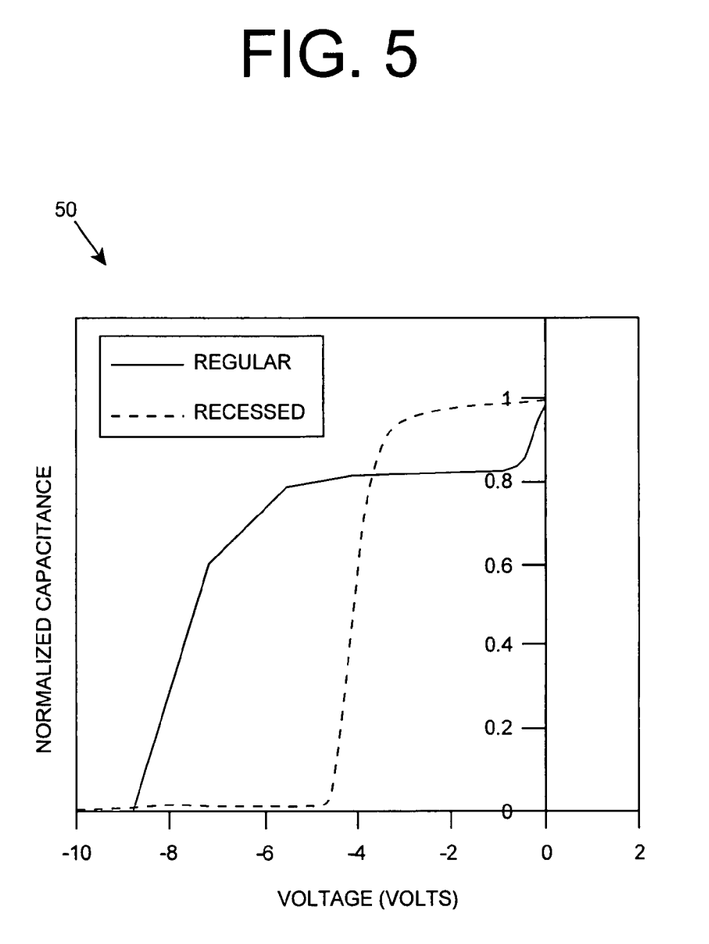
FIG. 5 shows a chart of normalized capacitance as a function of voltage for an illustrative HFET configured as shown in FIG. 4.
Figure 6A:
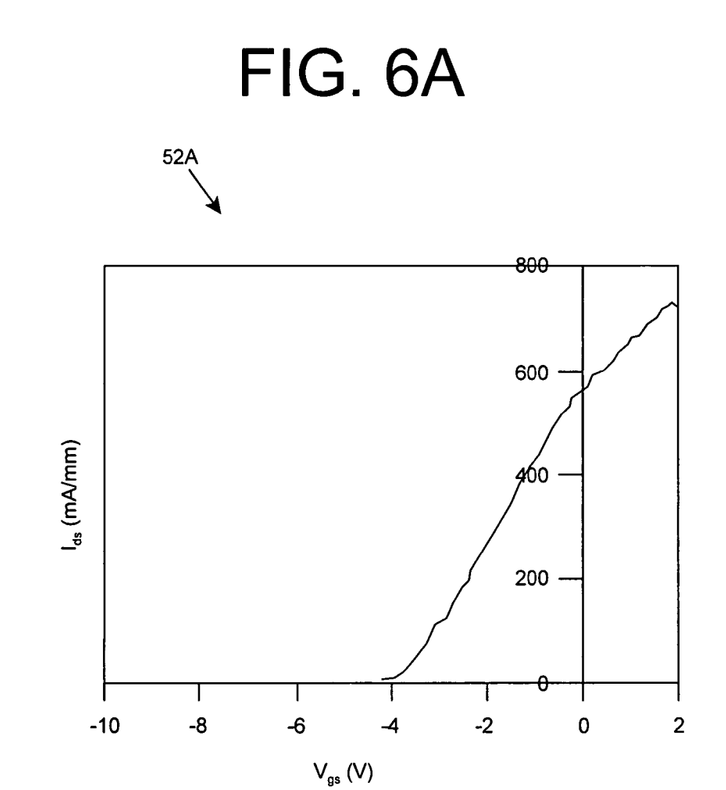
FIGS. 6A-B show charts of transfer characteristic and transconductance, respectively, as a function of gate-source voltage for an illustrative HFET configured as shown in FIG. 4.
Figure 6B:
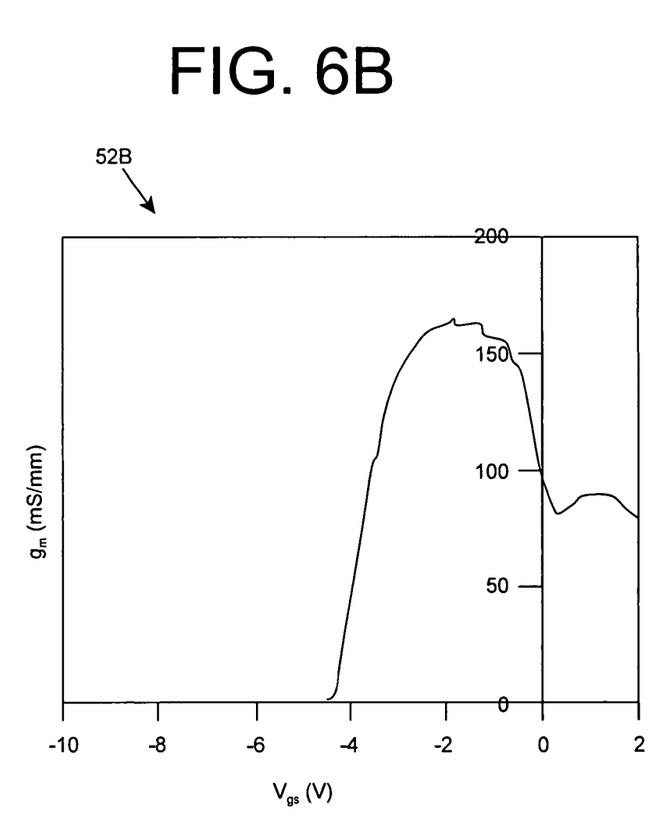

In operation, illustrative HFETs 40 produced as described herein have exhibited several advantages over alternative HFETs. For example, FIG. 5 shows a chart 50 of normalized capacitance as a function of voltage for both a regular HFET (e.g., no recessed gate) and an illustrative HFET 40 (FIG. 4). As shown, the capacitance-voltage depletion voltage for the regular HFET is approximately −9 Volts, while the depletion voltage for HFET 40 is approximately −4.5 Volts. Further, FIGS. 6A-B show charts 52A-B, respectively, of a transfer characteristic and a transconductance of an illustrative HFET 40 as a function of gate-source voltage ($V_{gs}$). Chart 52A shows that HFET 40 comprises a maximum saturation current ($I_{ds}$) of approximately 750 milliamps/millimeter (mA/mm), while chart 52B shows that HFET 40 comprises a maximum transconductance ($g_m$) of approximately 160 milliSiemens/millimeter (mS/mm). Both charts 52A-B show HFET 40 having a pinch-off gate-source voltage of approximately −4 Volts.

Figure 7:
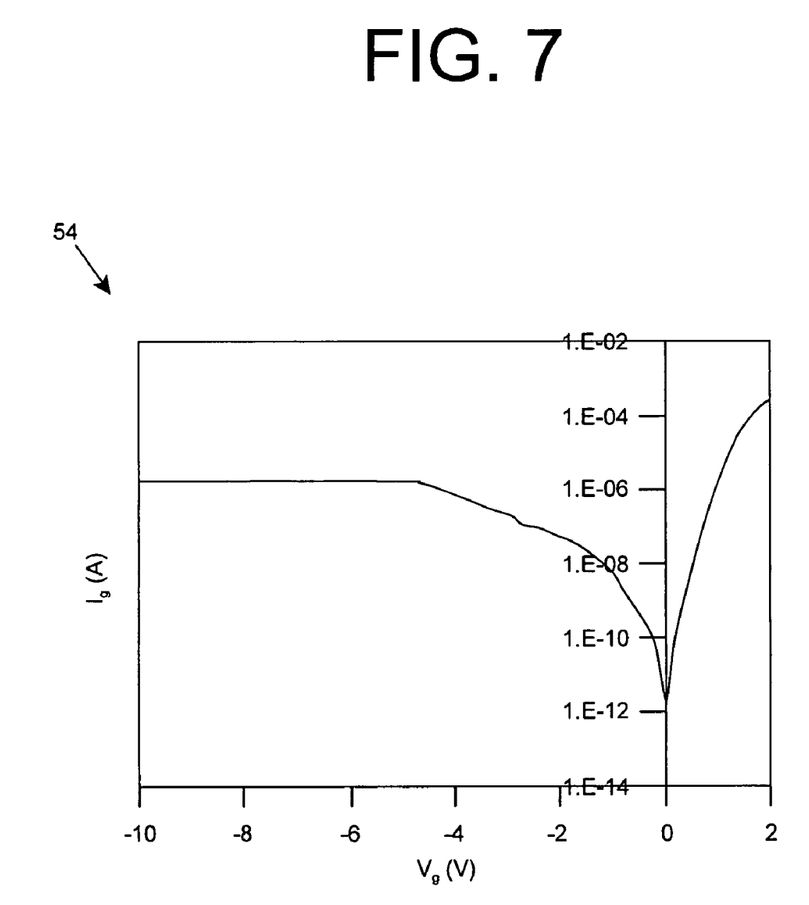
FIG. 7 shows a chart of gate leakage current as a function of gate voltage for an illustrative HFET configured as shown in FIG. 4.

Still further, FIG. 7 shows a chart 54 of gate leakage current ($I_g$) as a function of gate voltage ($V_g$) for an illustrative HFET 40 (FIG. 4). In particular, the gate leakage current is approximately two microAmps at a −10 Volt gate bias. The relatively low leakage current may indicate a high quality of the surface of barrier layer 20 (FIG. 4) after the etching and other processing required to apply recessed gate contact 24B (FIG. 4) to barrier layer 20.

Figure 8:
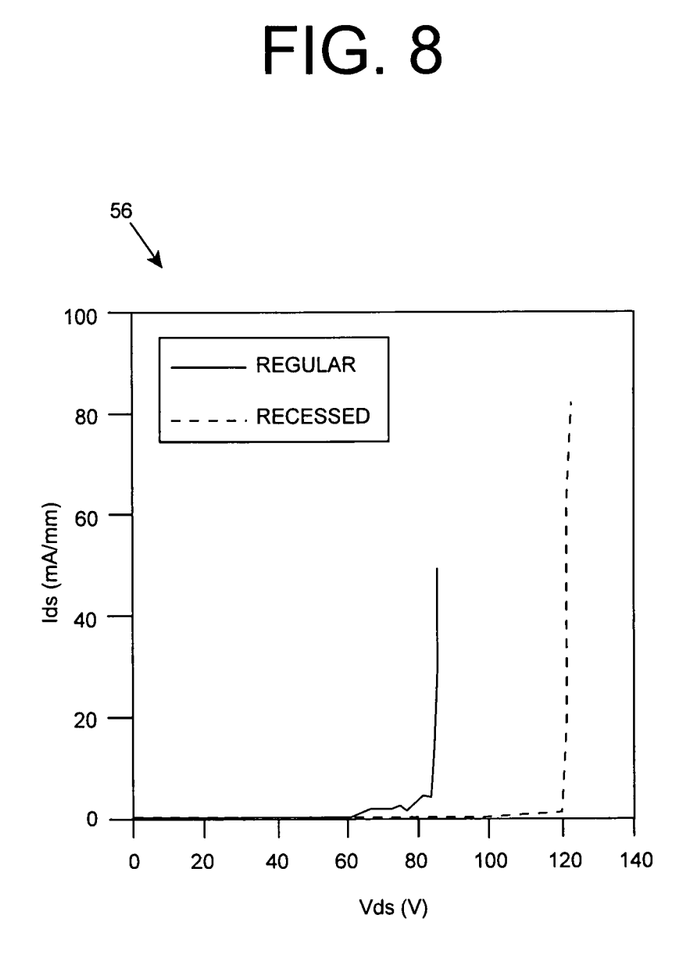
FIG. 8 shows a chart of drain current as a function of drain-source voltage for a conventional HFET and an illustrative HFET configured as shown in FIG. 4.

FIG. 8 shows a chart 56 of drain current ($I_{ds}$) as a function of drain-source voltage ($V_{ds}$) for a conventional (i.e., regular) HFET and an illustrative HFET 40 (FIG. 4). In each case, the drain current was measured with the corresponding device channel completely pinched off. Consequently, an abrupt increase of drain current occurs at the point of the drain breakdown voltage. For HFET 40 having a gate to drain space of approximately 2.5 micrometers, the drain breakdown voltage was approximately 122 Volts compared with a drain breakdown voltage of approximately 85 Volts for the conventional HFET, an improvement of nearly fifty percent.

Figure 9:
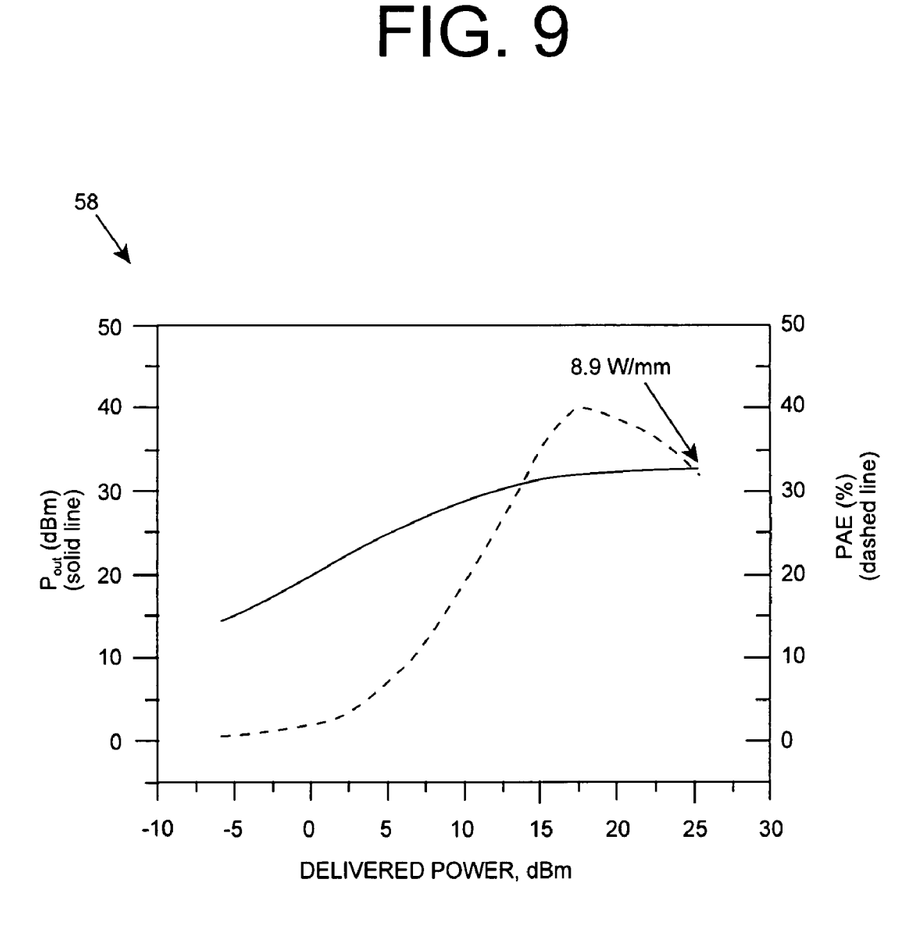
FIG. 9 shows a chart of microwave output power (Pout) and power added efficiency (PAE) as a function of delivered power for an illustrative HFET configured as shown in FIG. 4.

The improved breakdown characteristics shown in chart 56 enable HFET 40 (FIG. 4) to be biased at significantly higher drain voltages, which can be used, for example, to increase microwave output power. To this extent, FIG. 9 shows a chart 58 of microwave output power ($P_{out}$) and power added efficiency (PAE) as a function of delivered power for an illustrative HFET 40. HFET 40 was biased using class-A biasing conditions at a frequency of two gigahertz. In this case, the maximum microwave output power was approximately 8.9 Watts/millimeter (W/mm), while a maximum PAE of approximately 40% was measured at an output power of approximately 8.2 W/mm.

Figure 10:
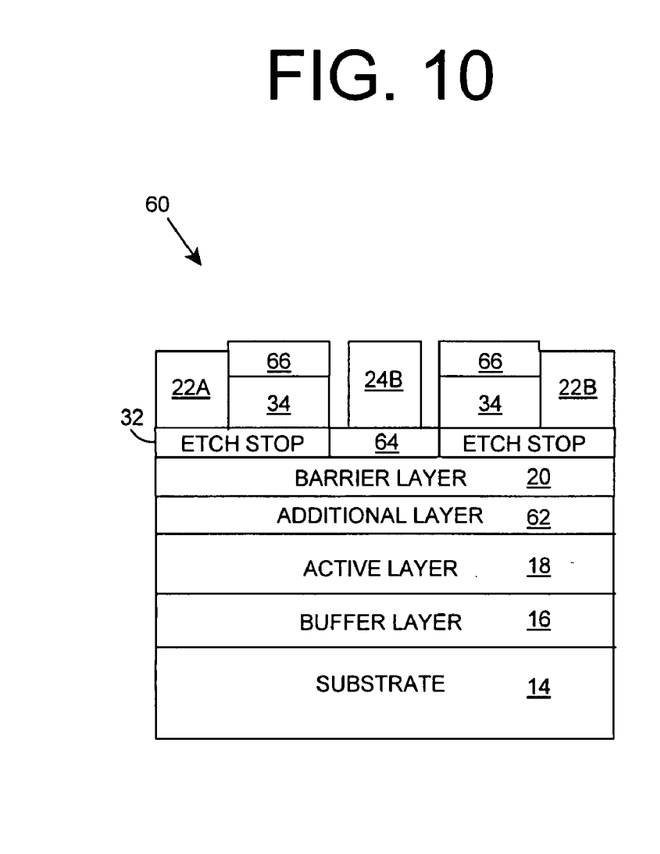
FIG. 10 shows an alternative HFET according to an embodiment of the invention.

It is understood that HFET 40 (FIG. 4) is only illustrative of various configurations for HFETs that can be produced using the invention. For example, FIG. 10 shows an alternative HFET 60 according to an embodiment of the invention. HFET 60 comprises a metal oxide double heterostructure field effect transistor (MOSDHFET) that includes an additional layer 62 that comprises InGaN. By including a double heterostructure and layer 62, one or more aspects of the performance of HFET 60 can be improved, such as a reduced current collapse. Further, HFET 60 includes a dielectric (insulator) layer 64 below recessed gate 24B. Dielectric layer 64 can comprise any type of dielectric material such as, for example, $SiO_2$. Still further, HFET 60 can include a passivation layer 66 that is applied above cap layer 34. Passivation layer 66 can comprise benzocyclobutene (BCB), silicon nitride ($Si_3N_4$), or the like, to prevent oxidation of cap layer 34. Alternatively, passivation layer 66 could comprise a dielectric, such as $SiO_2$. Numerous additional types/configurations for an HFET are possible. For example, an alternative HFET could comprise a metal oxide heterostructure field effect transistor (MOSHFET) or MOSDHFET configured similarly to HFET 60, but without additional layer 62.

In order to produce HFET 60, substrate 14 can be obtained, and buffer layer 16, active layer 18, additional layer 62, barrier layer 20, etch stop layer 32, cap layer 34 and passivation layer 66 can be applied in sequence using any solution. Subsequently, passivation layer 66 and cap layer 34 can be selectively etched using any solution, until portions of etch stop layer 32 are exposed for contacts 22A-B, 24B. Further, etch stop layer 32 can be selectively etched (e.g., using wet chemical etching) until a portion of barrier layer 20 is exposed for gate contact 24B. Dielectric layer 64 can be applied on the exposed portion of barrier layer 20, and contacts 22A-B, 24B can be applied to each of the corresponding areas. It is understood that these steps are only illustrative, and numerous alternative steps can be performed to product HFET 60.

Figure 11:
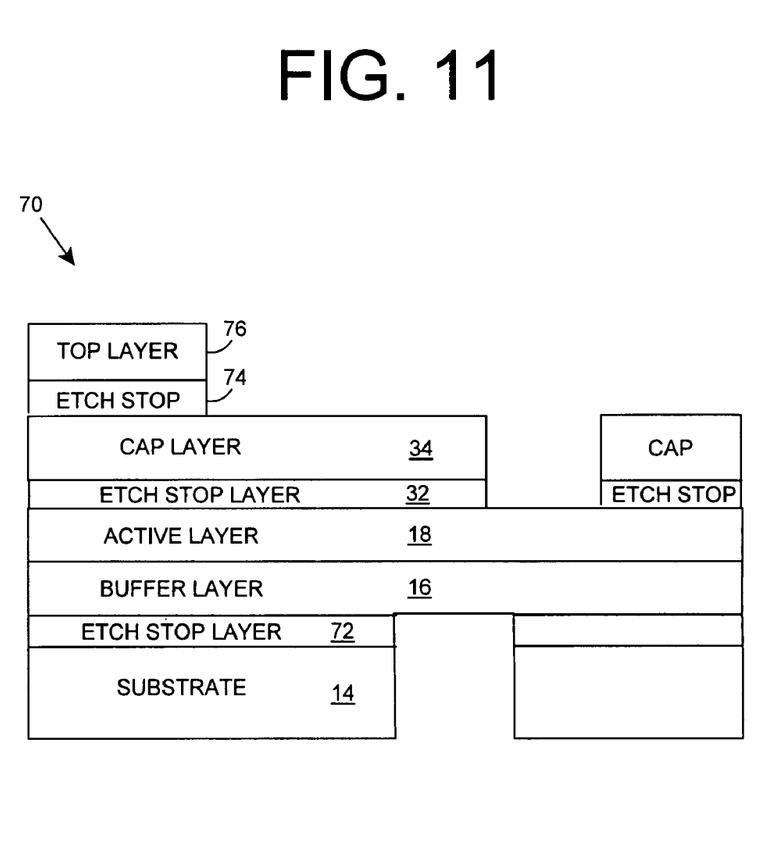
FIG. 11 shows an alternative heterostructure according to an embodiment of the invention.

Further, the heterostructure can include one or more additional etch stop layers 32 and/or etch stop layer 32 can be in a different location in the heterostructure to assist in selectively etching various other layers of the heterostructure. To this extent, FIG. 11 shows an alternative heterostructure 70 according to an embodiment of the invention. In addition to etch stop layer 32, heterostructure 70 includes an etch stop layer 72 disposed between substrate 14 and buffer layer 16, and an etch stop layer 74 disposed between cap layer 34 and a top layer 76 of, for example, AlGaN. Etch stop layer 74 can facilitate the selective etching of top layer 76, while etch stop layer 72 can facilitate the selective etching of buffer layer 16 and/or substrate 14 as shown. For example, substrate 14 can comprise an AlN, AlGaN, or the like, bulk substrate and etch stop layer 72 can comprise InN, InGaN, or the like. In this case, substrate 14 that can be selectively etched using RIE, and etch stop layer 72 can be selectively etched using wet chemical etching as described herein.

In addition to transistors, such as HFETs, the heterostructure and/or selective etching described herein can be used to generate various types of nitride-based heterostructure devices. For example, heterostructure 30 (FIG. 3) could be used to generate a nitride-based light emitting diode and/or a nitride-based laser. In either case, the inclusion of an etch stop layer that includes In can be used in etching an adjacent layer to generate a contact, a recess, a facet, and/or the like, to obtain desired configuration and/or performance characteristics for the device. Various other types of semiconductor, power switching, microwave, optoelectronic, acousto-optic, and/or the like devices can be produced using the invention. These devices include, for example, photodetectors, gated bipolar junction transistors, gate hot electron transistors, gated heterostructure bipolar junction transistors, sensors (e.g., gas, liquid, pressure, multi-function pressure and temperature, and/or the like), etc.

Further, the heterostructure and/or selective etching described herein can be used to produce a nitride-based integrated circuit. In this case, the integrated circuit can include one or more devices that are produced by selectively etching one or more layers with an etch stop layer that includes In. To this extent, each device can be incorporated in the integrated circuit using any solution, e.g., by forming physical connections between the device and one or more other devices in the integrated circuit. In one embodiment, the integrated circuit comprises a nitride-based Monolithic Microwave Integrated Circuit that includes one or more active or passive elements produced as described herein. Still further, the heterostructure and/or selective etching described herein can be used to produce a nitride-based Micro-Electro-Mechanical System. In any event, the resulting heterostructure(s), heterostructure device(s), integrated circuit(s) and/or Micro-Electro-Mechanical Systems can be patterned in a periodic fashion to form a photonic crystal using any solution.

The foregoing description of various aspects of the invention has been presented for purposes of illustration and description. It is not intended to be exhaustive or to limit the invention to the precise form disclosed, and obviously, many modifications and variations are possible. Such modifications and variations that may be apparent to an individual in the art are included within the scope of the invention as defined by the accompanying claims.

What is claimed is:

1. A method of producing a nitride-based heterostructure, the method comprising:
    obtaining a partial nitride-based heterostructure;
    applying a nitride-based etch stop layer including indium (In) above the partial nitride-based heterostructure;
    applying a nitride-based cap layer including aluminum (Al) directly on the etch stop layer;
    selectively etching the cap layer to expose at least a portion of a top surface of the etch stop layer, wherein the selectively etching stops when the at least a portion of the top surface of the etch stop layer is exposed; and
    selectively etching the etch stop layer using a different etching process than the selectively etching the cap layer.

2. The method of claim 1, wherein the cap layer further includes at least one of: gallium (Ga), or indium (In).

3. The method of claim 1, wherein the partial nitride-based heterostructure comprises an AlN/GaN/InN based heterostructure.

4. The method of claim 1, wherein the etch stop layer comprises a thin InGaN epilayer.

5. The method of claim 1, wherein the selectively etching uses reactive ion etching (RIE).

6. The method of claim 1, further comprising applying a passivation layer above the cap layer.

7. The method of claim 1, wherein the selectively etching the etch stop layer uses chemical etching.

8. The method of claim 1, wherein the obtaining includes:
    obtaining a substrate;
    applying a buffer layer above the substrate;
    applying a first layer above the buffer layer; and
    applying a second layer above the first layer.

9. The method of claim 8, wherein the second layer has a molar fraction of Al that is different than a molar fraction of Al for the first layer.

10. The method of claim 8, wherein the obtaining further includes:
    applying a second etch stop layer including In on at least one of: the substrate, the buffer layer, or the first layer; and
    selectively etching at least one of: the substrate, the buffer layer, the first layer, or the second layer such that at least a portion of the second etch stop layer is exposed.

11. The method of claim 1, further comprising applying a dielectric layer above at least one of: the partial nitride-based heterostructure, the etch stop layer or the cap layer.

12. A method of producing a nitride-based heterostructure, the method comprising:
    obtaining a nitride-based heterostructure, the nitride-based heterostructure including an etch stop layer that includes indium (In) and an adjacent layer to the etch stop layer, the adjacent layer having substantially no indium (In) and including aluminum (Al);
    selectively etching the adjacent layer to expose at least a portion of a bottom or a top surface of the etch stop layer, wherein the selectively etching stops when the at least a portion of the bottom surface or the top surface of the etch stop layer is exposed; and
    selectively etching the etch stop layer using a different etching process than the selectively etching the adjacent layer.

13. The method of claim 12, wherein the adjacent layer comprises a substrate.

14. A method of producing a nitride-based heterostructure device, the method comprising:

obtaining a partial nitride-based heterostructure;
applying a nitride-based etch stop layer including indium (In) above the partial nitride-based heterostructure;
applying a nitride-based cap layer having substantially no In directly on the etch stop layer;
selectively etching the cap layer to expose at least a portion of a top surface of the etch stop layer, wherein the selectively etching stops when the at least a portion of the top surface of the etch stop layer is exposed; and
selectively etching the etch stop layer using a different etching process than the selectively etching the cap layer.

15. The method of claim 14, further comprising applying a contact within the etched portion of the partial nitride-based heterostructure.

16. The method of claim 14, wherein the nitride-based heterostructure device comprises one of: a nitride-based heterostructure field effect transistor (HFET), a light emitting diode, a laser, or a micro-electro-mechanical device.

17. The method of claim 14, wherein the selectively etching is performed in order to generate at least one of a recessed contact, or a facet for the device.

18. The method of claim 14, further comprising applying a passivation layer above the cap layer.

19. The method of claim 14, further comprising applying a dielectric layer above at least one of: the partial nitride-based heterostructure, the etch stop layer or the cap layer.

20. A method of producing a nitride-based integrated circuit, the method comprising:
producing at least one nitride-based heterostructure device, the producing comprising:
obtaining a partial nitride-based heterostructure;
applying a nitride-based etch stop layer comprising indium (In) above the partial nitride-based heterostructure;
applying a nitride-based cap layer including aluminum (Al) directly on the etch stop layer; and
generating at least one of a recessed contact, a facet, or a photonic crystal for the device, the generating including selectively etching the cap layer to expose at least a portion of a top surface of the etch stop layer, wherein the selectively etching stops when the at least a portion of the top surface of the etch stop layer is exposed; then
selectively etching the etch stop layer using a different etching process than the selectively etching the cap layer; and
incorporating the nitride-based heterostructure device in the integrated circuit.

21. The method of claim 20, wherein the integrated circuit comprises a nitride-based Monolithic Microwave Integrated Circuit.

* * * * *